(12) United States Patent
Meng et al.

(10) Patent No.: US 12,408,445 B2
(45) Date of Patent: Sep. 2, 2025

(54) DETECTION SUBSTRATE AND MANUFACTURING METHOD THEREFOR, AND RAY DETECTION APPARATUS

(71) Applicant: BOE Technology Group Co., Ltd., Beijing (CN)

(72) Inventors: Fanli Meng, Beijing (CN); Jiangbo Chen, Beijing (CN); Zeyuan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 350 days.

(21) Appl. No.: 17/921,605

(22) PCT Filed: May 24, 2021

(86) PCT No.: PCT/CN2021/095617
§ 371 (c)(1),
(2) Date: Oct. 26, 2022

(87) PCT Pub. No.: WO2021/254102
PCT Pub. Date: Dec. 23, 2021

(65) Prior Publication Data
US 2023/0178675 A1    Jun. 8, 2023

(30) Foreign Application Priority Data

Jun. 15, 2020    (CN) .......................... 202010542079.6

(51) Int. Cl.
*H10F 30/225*    (2025.01)
*H10F 39/10*    (2025.01)

(52) U.S. Cl.
CPC ......... *H10F 30/225* (2025.01); *H10F 39/107* (2025.01)

(58) Field of Classification Search
None
See application file for complete search history.

(56) References Cited

U.S. PATENT DOCUMENTS

| | | |
|---|---|---|
| 6,005,276 A | 12/1999 | Forrest et al. |
| 8,253,212 B2 | 8/2012 | Wronski et al. |

(Continued)

FOREIGN PATENT DOCUMENTS

| | | |
|---|---|---|
| CN | 104810377 A | 7/2015 |
| CN | 109742176 A | 5/2019 |

(Continued)

OTHER PUBLICATIONS

CN202010542079.6 first office action.

(Continued)

*Primary Examiner* — Benjamin P Sandvik
(74) *Attorney, Agent, or Firm* — IPro, PLLC

(57) ABSTRACT

Provided are a detection substrate and a manufacturing method therefor, and a ray detection apparatus. The detection substrate includes: a driving back plate, wherein the driving back plate is provided with a plurality of detection regions, and each detection region includes a thin-film transistor located on a base substrate, and a first bonding electrode that is located on the thin-film transistor and is electrically connected to a source electrode of the thin-film transistor; and a plurality of avalanche photodiodes, wherein the plurality of avalanche photodiodes are arranged in the detection regions one by one, and a second bonding electrode that is fixedly connected to the first bonding electrode is arranged on the side of each avalanche photodiode that faces the driving back plate.

18 Claims, 12 Drawing Sheets

(56) References Cited

U.S. PATENT DOCUMENTS

| | | | |
|---|---|---|---|
| 2005/0205930 A1* | 9/2005 | Williams, Jr. | H01L 21/76254 |
| | | | 257/E21.703 |
| 2017/0094220 A1* | 3/2017 | Kurokawa | H04N 25/78 |
| 2017/0186798 A1* | 6/2017 | Yang | H10F 39/805 |
| 2017/0263661 A1* | 9/2017 | Ikeda | H10F 39/80377 |
| 2020/0105812 A1* | 4/2020 | Sze | H10F 39/8027 |
| 2021/0028225 A1 | 1/2021 | Zhang | |
| 2021/0225823 A1 | 7/2021 | Liang et al. | |
| 2022/0128718 A1* | 4/2022 | Hofrichter | G01N 23/18 |
| 2022/0415950 A1* | 12/2022 | Klamkin | H10F 30/223 |
| 2023/0097928 A1 | 3/2023 | Su et al. | |

FOREIGN PATENT DOCUMENTS

| | | |
|---|---|---|
| CN | 109904186 A | 6/2019 |
| CN | 110350063 A | 10/2019 |
| CN | 110945659 A | 3/2020 |
| CN | 111653645 A | 9/2020 |
| JP | S62104178 A | 5/1987 |

OTHER PUBLICATIONS

CN202010542079.6 second office action.
CN202010542079.6 third office action.
PCT/CN2021/095617 international search report.

\* cited by examiner

DETECTION SUBSTRATE AND MANUFACTURING METHOD THEREFOR, AND RAY DETECTION APPARATUS

CROSS REFERENCE TO RELATED APPLICATIONS

The present disclosure is a US National Stage of International Application No. PCT/CN2021/095617, filed on May 24, 2021, which claims priority to the Chinese Patent Application No. 202010542079.6, filed to China Patent Office on Jun. 15, 2020, and entitled "DETECTION PANEL AND MANUFACTURING METHOD THEREFOR, AND RAY DETECTION APPARATUS", the entire content of which is incorporated herein by reference.

FIELD

The present disclosure relates to the technical field of flat panel detectors, in particular to a detection substrate and a manufacturing method therefor, and a ray detection apparatus.

BACKGROUND

A flat panel detector (FPD) is an essential element in a digital image technology. Because of advantages of a high imaging speed, a good space and density resolution, a high signal-to-noise ratio, direct data output and the like, the FPD is widely applied to medical images (such as chest X-ray), industrial inspection (such as metal crack detection), security detection, air transportation, and other fields.

SUMMARY

An embodiment of the present disclosure provides a detection substrate, including: a driving back plate, wherein the driving back plate has a plurality of detection regions, and each detection region includes a thin-film transistor located on a base substrate, and a first bonding electrode that is located on the thin-film transistor and is electrically connected to a source electrode of the thin-film transistor; and a plurality of avalanche photodiodes, wherein the plurality of avalanche photodiodes are arranged in the plurality of detection regions one by one, and a second bonding electrode that is fixedly connected to the first bonding electrode is arranged on a side of each avalanche photodiode that faces the driving back plate.

Optionally, in the above detection substrate provided by the embodiment of the present disclosure, the first bonding electrode is fixedly connected to the second bonding electrode through conductive adhesive.

Optionally, in the above detection substrate provided by the embodiment of the present disclosure, the first bonding electrode is the same as the second bonding electrode in shape, and an orthographic projection of the second bonding electrode on the base substrate is located within a scope of an orthographic projection of the first bonding electrode on the base substrate.

Optionally, in the above detection substrate provided by the embodiment of the present disclosure, the first bonding electrode and the second bonding electrode constitute a central electrode, and an annular electrode is arranged on a side of each avalanche photodiode facing away from the driving back plate.

Optionally, in the above detection substrate provided by the embodiment of the present disclosure, each avalanche photodiode includes a heavily-doped N-type region, a first type doping region, a second type doping region and a heavily-doped P-type region which are laminated in sequence between a film layer where the second bonding electrode is located and a film layer where the annular electrode is located; and the heavily-doped P-type region is electrically connected to the annular electrode, and the heavily-doped N-type region is electrically connected to the central electrode.

Optionally, in the above detection substrate provided by the embodiment of the present disclosure, each avalanche photodiode includes a reference voltage wire electrically connected to the annular electrode, the reference voltage wire is arranged on the same layer as the annular electrode, and the reference voltage wire is located between two adjacent rows of the detection regions.

Optionally, in the above detection substrate provided by the embodiment of the present disclosure, the first bonding electrode includes a first central electrode and a first annular electrode arranged around the first central electrode which are arranged on the same layer, and the second bonding electrode includes a second central electrode and a second annular electrode arranged around the second central electrode which are arranged on the same layer; and the first central electrode and the second central electrode are electrically connected to constitute a central electrode, and the first annular electrode and the second annular electrode are electrically connected to constitute an annular electrode.

Optionally, in the above detection substrate provided by the embodiment of the present disclosure, each avalanche photodiode includes: a heavily-doped N-type region, a heavily-doped P-type region arranged around the heavily-doped N-type region, a first type doping region located on a side of the heavily-doped N-type region facing away from a corresponding thin-film transistor, and a second type doping region located on the first type doping region and covering a corresponding detection region; wherein the heavily-doped N-type region is electrically connected to a corresponding central electrode, and the heavily-doped P-type region is electrically connected to a corresponding annular electrode.

Optionally, the above detection substrate provided by the embodiment of the present disclosure further includes a reference voltage wire electrically connected to the annular electrode, wherein the reference voltage wire is arranged on the same layer as the first annular electrode, and the reference voltage wire is located between two adjacent rows of the detection regions.

Optionally, the above detection substrate provided by the embodiment of the present disclosure further includes: a first planarization layer located on a side of the driving back plate facing the avalanche photodiodes, and a second planarization layer located on a side of the avalanche photodiodes facing the driving back plate.

The first planarization layer is arranged to be flush with the first bonding electrode, and the second planarization layer is arranged to be flush with the second bonding electrode.

Optionally, the above detection substrate provided by the embodiment of the present disclosure further includes a protective ring arranged around each heavily-doped N-type region.

Correspondingly, an embodiment of the present disclosure further provides a ray detection apparatus, including the above detection substrate provided by the embodiment of the present disclosure.

Correspondingly, an embodiment of the present disclosure further provides a manufacturing method for the above detection substrate, including: forming, in each detection region of a base substrate, a thin-film transistor and a first bonding electrode electrically connected to a source electrode of the thin-film transistor which are laminated in sequence, so as to form a driving back plate; forming, on a Si base substrate, an oxidation embedded layer, an avalanche photodiode, and a second bonding electrode electrically connected to the avalanche photodiode which are laminated in sequence; fixedly connecting the first bonding electrode and the second bonding electrode; and stripping off the oxidation embedded layer.

DETAILED DESCRIPTION OF THE EMBODIMENTS

Figure 1:
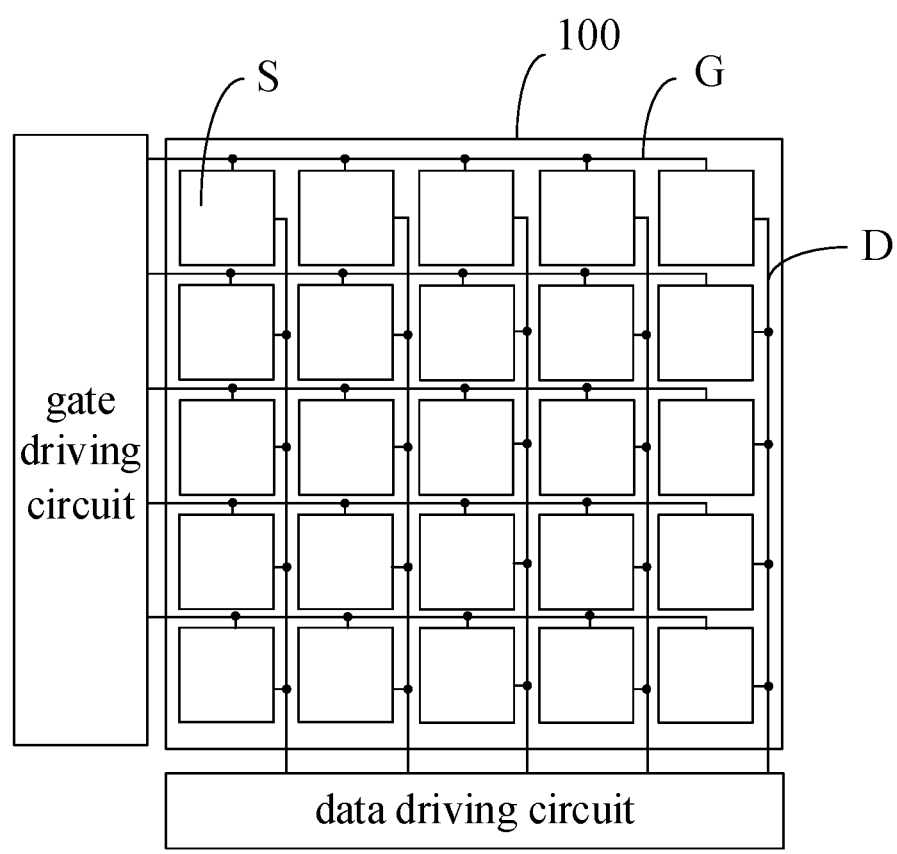
FIG. 1 is a top-view schematic structural diagram of a detection substrate provided by an embodiment of the present disclosure.

In order to make objectives, technical solutions and advantages of embodiments of the present disclosure clearer, the technical solutions of the embodiments of the present disclosure will be clearly and completely described below in combination with the accompanying drawings of the embodiments of the present disclosure. Apparently, the described embodiments are some embodiments of the present application, rather than all the embodiments. Under the circumstance of no conflict, the embodiments of the present disclosure and features in the embodiments may be combined with each other. Based on the embodiments of the present application, all other embodiments obtained by those of ordinary skill in the art without creative efforts fall within the protection scope of the present disclosure.

Unless otherwise defined, technical or scientific terms used herein shall have the ordinary meaning as understood by those of ordinary skill in the art to which the present disclosure belongs. Similar words such as "comprise" and "include" used in the disclosure mean that elements or items appearing before the words encompass elements or items listed after the words and their equivalents, but do not exclude other elements or items. Similar words such as "connected" and "linked" are not limited to physical or mechanical connections, but may include electrical connections, whether direct or indirect. "Inner", "outer", "upper", "lower", etc. are only used to Indicate a relative positional relationship, and when an absolute position of a described object changes, the relative positional relationship may also change accordingly.

It should be noted that dimensions and shapes of all figures in the accompanying drawings do not reflect a real scale, and are only intended to illustrate contents of the present disclosure. The same or similar reference numerals refer to the same or similar elements or elements having the same or similar functions throughout.

An embodiment of the present disclosure provides a detection substrate. As shown in FIG. 1, the detection substrate includes: a driving back plate 100. The driving back plate 100 has a plurality of detection regions S, the plurality of detection region S are defined by a plurality of scanning lines G and data lines D which are arranged in an intersecting manner, the scanning lines G are electrically connected to one or more scanning driving circuits, the one or more scanning driving circuits are configured to input scanning signals into the scanning lines G, the data lines D are electrically connected to one or more data driving circuits, and the one or more data driving circuits are configured to input data signals into the data lines D.

Figure 2:
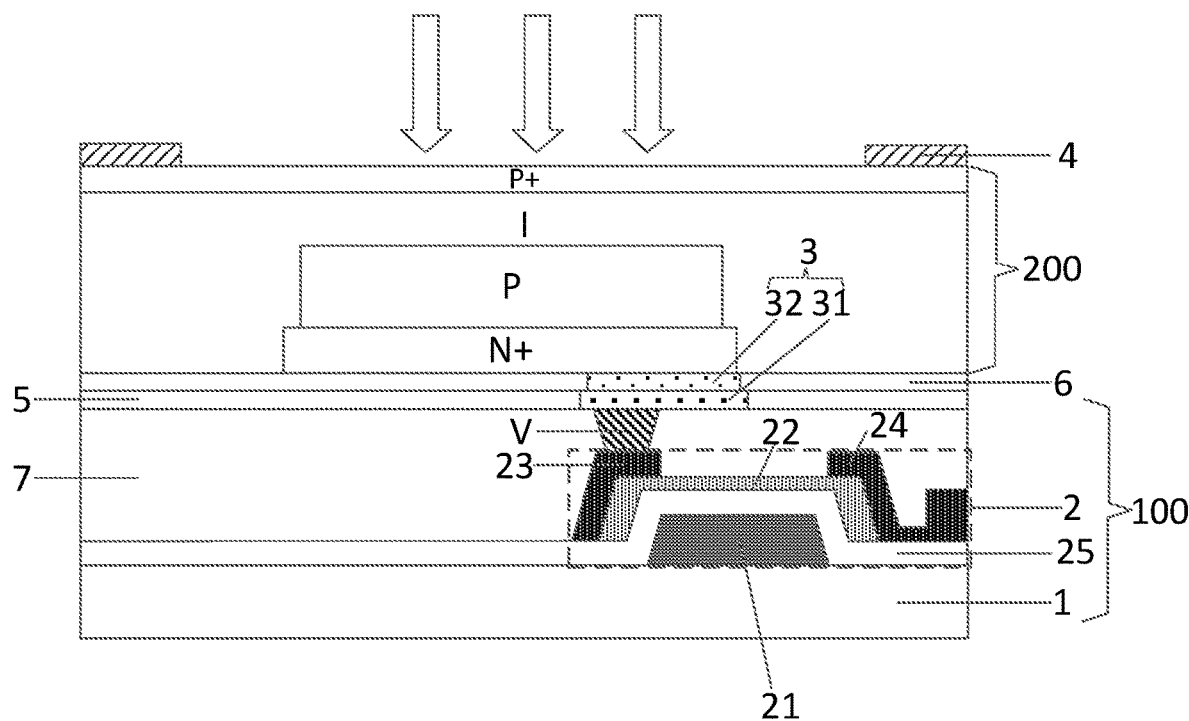
FIG. 2 is a top-view schematic diagram of a sectional schematic structural diagram of one detection region in the detection substrate shown in FIG. 1.
Figure 3:
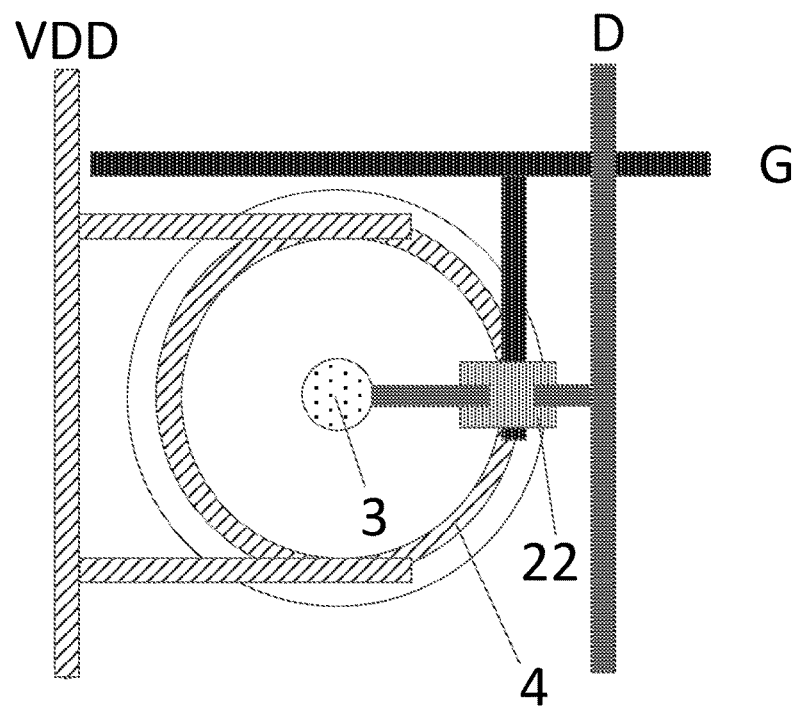
FIG. 3 is the top-view schematic structural diagram shown in FIG. 2.
Figure 4:
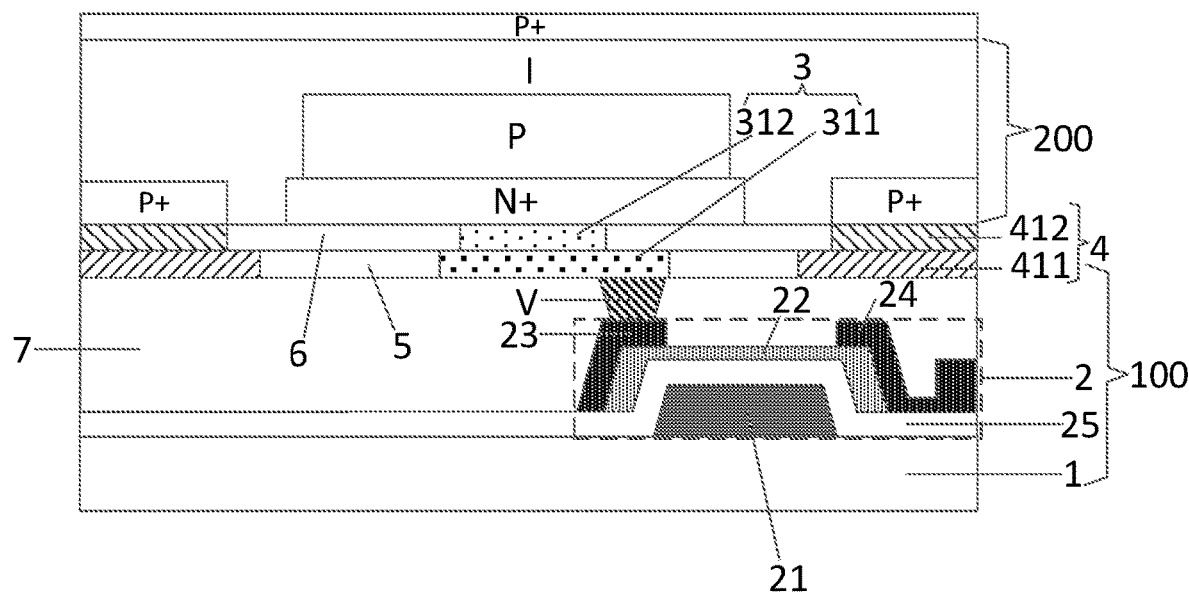
FIG. 4 is another top-view schematic diagram of a sectional schematic structural diagram of one detection region in the detection substrate shown in FIG. 1.
Figure 5:
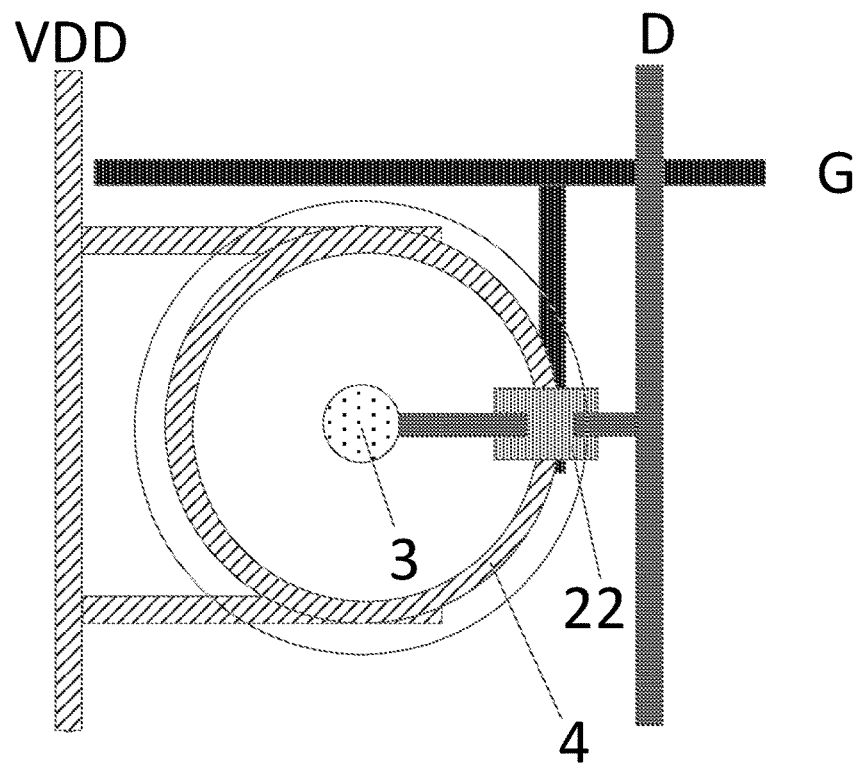
FIG. 5 is the top-view schematic structural diagram shown in FIG. 4.

To take one of the detection region S as an example, as shown in FIG. 2 to FIG. 5, FIG. 2 and FIG. 4 are respectively sectional schematic structural diagrams of one detection region S in the detection substrate shown in FIG. 1, FIG. 3 is a top-view schematic structural diagram of a part of film layers in the detection substrate shown in FIG. 2, and FIG. 5 is a top-view schematic structural diagram of a part of film layers in the detection substrate shown in FIG. 4. Each detection region S includes a thin-film transistor 2 located on a base substrate 1 and a first bonding electrode 31 that is located on the thin-film transistor 2 and is electrically connected to a source electrode 23 of the thin-film transistor 2.

The detection substrate further includes a plurality of avalanche photodiodes 200. The plurality of avalanche photodiodes 200 are arranged in the plurality of detection regions one by one; and a second bonding electrode 32 that is fixedly connected to the first bonding electrode 31 is arranged on a side of each avalanche photodiode 200 that faces the driving back plate 100.

According to the above detection substrate provided by the embodiment of the present disclosure, because large-size production may be realized by means of the driving back plate 100 made of the thin-film transistors 2, and the avalanche photodiodes 200 can realize weak light detection, the detection substrate of the present disclosure that is formed by the driving back plate 100 and the avalanche photodiodes 200 in an electrode binding manner may realize characteristics of a large size and weak light detection at the same time.

In specific implementation, in the above detection substrate provided by the embodiment of the present disclosure, the base substrate may be a glass substrate, the glass substrate is generally large in size, a driving back plate in a relatively large size may be obtained by forming an array of thin-film transistors on the glass substrate through an etching process, and the plurality of avalanche photodiodes are integrated on the driving back plate so as to obtain the detection substrate that can realize the characteristics of a large size and weak light detection. Of course, the base substrate may be other substrates in a large size.

In specific implementation, in the above detection substrate provided by the embodiment of the present disclosure, as shown in FIG. 2 and FIG. 4, the first bonding electrode 31 and the second bonding electrode 32 may be fixedly connected through conductive adhesive (not shown). Specifically, the conductive adhesive may be an anisotropic conductive film (ACF), the ACF may adhere to the first bonding electrode 31, then the second bonding electrode 32 is directly aligned with the first bonding electrode 31, and the ACF is used as an adhesive medium material to conduct the first bonding electrode 31 and the second bonding electrode 32, thereby realizing electrical connection between the avalanche photodiodes 200 and the thin-film transistors 2 on the driving back plate 100.

Of course, in specific implementation, the first bonding electrode 31 and the second bonding electrode 32 may also be electrically connected in a bonding manner, for example, thermal bonding, wire bonding, etc.

In specific implementation, because the first bonding electrode and the second bonding electrode need to be fixedly connected in an aligned manner, in order to improve a conducting performance of them and lower contact resistance between them, in the above detection substrate provided by the embodiment of the present disclosure, as shown in FIG. 2 to FIG. 5, the first bonding electrode 31 and the second bonding electrode 32 are generally the same in shape, and an orthographic projection of the second bonding electrode 32 on the base substrate 1 is located within the scope of an orthographic projection of the first bonding electrode 31 on the base substrate 1.

Specifically, each avalanche photodiode is a p-n junction type light detection diode, which uses an avalanche multiplication effect of an interceptor to amplify an optoelectronic signal so as to improve a detection sensitivity. A basic structure thereof is usually a Read diode structure (i.e. an N+PIP+ structure, wherein a P+ face receives light) that can easily generate the avalanche multiplication effect, and a relatively large reverse bias voltage is applied in a working process so that the diode reaches an avalanche multiplication status. A light absorbing region thereof is generally consistent with a multiplication region (a P region with a high electric field and an I region with a high electric field).

A specific structure and a working principle of the avalanche photodiodes provided by the embodiments of the present disclosure will be described in detail below.

In one possible implementation, in the above detection substrate provided by the embodiment of the present disclosure, as shown in FIG. 3 and FIG. 5, the first bonding electrode 31 and the second bonding electrode 32 constitute the central electrode 3, and an annular electrode 4 is arranged on a side of each avalanche photodiode 200 facing away from the driving back plate 100. Specifically, the central electrode 3 may be a circular or a square block-shaped electrode, and the annular electrode 4 may be a circular or a square annular electrode.

In specific implementation, in the above detection substrate provided by the embodiment of the present disclosure, as shown in FIG. 2, the avalanche photodiode 200 may include a heavily-doped N-type region (N+), a first type doping region (such as a P-type region), a second type doping region (such as an intrinsic layer I) and a heavily-doped P-type region (P+) which are laminated in sequence between a film layer where the second bonding electrode 32 is located and a film layer where the annular electrode 4 is located.

The heavily-doped P-type region (P+) is electrically connected to the annular electrode 4, and the heavily-doped N-type region (N+) is electrically connected to the central electrode 3.

Specifically, as shown in FIG. 2, the avalanche photodiode 200 is still of a P-N junction structure form, but a P-type material therein is constituted by three parts. A photon (shown by the arrow) emits from the P+ layer and enters the intrinsic layer I, and then the material absorbs luminous energy and generates an initial electron-hole pair. At the moment, on the intrinsic layer I, a phoelectron is quickened by a relatively weak electric field on a depletion layer and moves towards the P-N junction. When the phoelectron moves to a high electric field region, the avalanche collision effect is generated due to an accelerating effect of a strong electric field. Finally, the phoelectron obtaining avalanche multiplication reaches the N+ layer, and a hole is absorbed by the P+ layer. The P+ layer is made a high doping layer in order to reduce the contact resistance, thereby facilitating electrical connection to the annular electrode 4.

In specific implementation, the above detection substrate provided by the embodiment of the present disclosure, as shown in FIG. 3, further includes a reference voltage wire VDD electrically connected to the annular electrode 4. The reference voltage wire VDD is electrically connected to an external reverse high-voltage electrode, and the reference voltage wire VDD is arranged on the same layer as the annular electrode 4. In this way, a pattern of the reference voltage wire VDD and the annular electrode 4 may be formed through a one-time patterning process merely by changing an original pattern when the annular electrode 4 is formed. It is not necessary to add a process of separately preparing the reference voltage wire VDD, preparing processes and procedures may be simplified, a production cost is reduced, and a production efficiency is improved. In order to avoid influence on an aperture of each detection region, the reference voltage wire VDD is arranged between two adjacent rows of detection regions S in FIG. 1.

Figure 6:
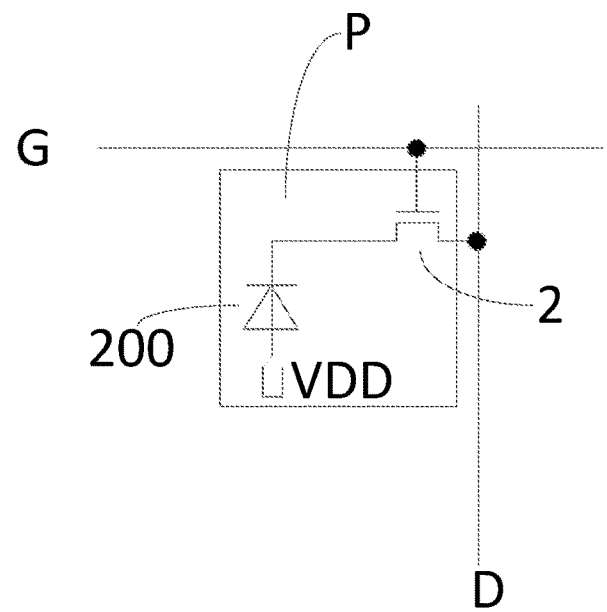
FIG. 6 is an equivalent circuit structural diagram of FIG. 2 and FIG. 4.

As shown in FIG. 6, FIG. 6 is an equivalent circuit structural diagram of one detection region S in FIG. 1. The relatively large reverse bias voltage is input by the reference voltage wire VDD, incident light irradiates the avalanche photodiodes 200, the avalanche photodiodes 200 output a multiplied photocurrent, and the photocurrent is transmitted to an external IC through the thin-film transistor 2 to save image data.

In one possible implementation, in the above detection substrate provided by the embodiment of the present disclosure, as shown in FIG. 4, each first bonding electrode includes a first central electrode 311 and a first annular electrode 411 arranged around the first central electrode 311, where the first central electrode 311 and the first annular electrode 411 are arranged on the same layer, and each second bonding electrode includes a second central electrode 312 and a second annular electrode 412 arranged around the second central electrode 312, where the second central electrode 312 and the second annular electrode 412 are arranged on the same layer; and the first central electrode 311 and the second central electrode 312 are electrically connected to constitute a central electrode 3, and the first annular electrode 411 and the second annular electrode 412 are electrically connected to constitute an annular electrode 4.

Specifically, a structure in FIG. 4 is described by taking the central electrode 3 and the annular electrode 4 arranged on the same layer as an example. In specific manufacturing, the first central electrode 311 and the first annular electrode 411 are formed by a one-time pattering process, and the second central electrode 312 and the second annular electrode 412 are formed by a one-time pattering process, so the preparing processes and procedures may be simplified, the production cost is reduced, and the production efficiency is improved.

In one possible implementation, in the above detection substrate provided by the embodiment of the present disclosure, as shown in FIG. 4, the avalanche photodiode 200 includes: a heavily-doped N-type region (N+), a heavily-doped P-type region (P+) arranged around the heavily-doped N-type region (N+), a first type doping region (such as the P-type region) located on a side of the heavily-doped N-type region (N+) facing away from the corresponding thin-film transistor 2, and a second type doping region (such as the intrinsic layer I) located on the first type doping region (P) and covering one detection region P in FIG. 1. The heavily-doped N-type region (N+) is electrically connected to the central electrode 3, and the heavily-doped P-type region (P+) is electrically connected to the annular electrode 4. Specifically, the heavily-doped P-type region (P+) may be the same as the annular electrode 4 in shape.

It should be noted that, in FIG. 4, a heavily-doped P-type region (P+) is further arranged on a side of the second type doping region (I) facing away from the base substrate 1. The heavily-doped P-type region (P+) is a film layer preserved when a Si base substrate (SOI substrate) is manufactured, which will be explained in detail in a subsequent manufacturing method. The heavily-doped P-type region (P+) is not a film layer of the avalanche photodiode 200 and is equivalent to a substrate.

It should be noted that, a working principle of the avalanche photodiode 200 shown in FIG. 4 is basically the same as a working principle of the avalanche photodiode 200 shown in FIG. 2. They are merely different in locations of the annular electrode 4. An electric field formed in FIG. 2 is a vertical electric field, and an electric field formed in FIG. 4 is a horizontal arc-shaped electric field, but they are the same in working principle, so the working principle of the avalanche photodiode 200 shown in FIG. 4 will not be described here and reference may be made to the working principle of the avalanche photodiode 200 shown in FIG. 2.

In specific implementation, the above detection substrate provided by the embodiment of the present disclosure, as shown in FIG. 5, further includes a reference voltage wire VDD electrically connected to the annular electrode 4. The reference voltage wire VDD is electrically connected to an external reverse high-voltage electrode, and the reference voltage wire VDD is arranged on the same layer as the first annular electrode 411. In this way, a pattern of the reference voltage wire VDD and the first annular electrode 411 may be formed through a one-time patterning process merely by changing an original pattern when the first annular electrode 411 is formed. It is not necessary to add a process of separately preparing the reference voltage wire VDD, preparing processes and procedures may be simplified, a production cost is reduced, and a production efficiency is improved. In order to avoid influence on an aperture of each detection region, the reference voltage wire VDD is arranged between two adjacent rows of detection regions S in FIG. 1.

It should be noted that an equivalent circuit diagram of a structure shown in FIG. 4 is the same as an equivalent circuit of a structure shown in FIG. 2, and the structures have the same working principle of outputting the multiplied photocurrent and outputting the photocurrent to the external IC, as shown in FIG. 6.

It should be noted that, in the avalanche photodiodes 200 in the above FIG. 2 and FIG. 4 provided by the embodiment of the present disclosure, locations of the heavily-doped P-type region (P+) and the heavily-doped N-type region (N+) may be switched. At the moment, the original first type doping region (such as the P-type region) needs to be set to be an N-type region. In a manufacturing process, the structures in FIG. 2 and FIG. 4 are manufactured on the SOI substrate (a Si substrate, an oxidation embedded layer and a heavily-doped P-type layer), and the structures obtained after switching still need to be manufactured on the SOI substrate (a Si substrate, an oxidation embedded layer and a heavily-doped N-type layer).

It should be noted that the avalanche photodiodes 200 in the above FIG. 2 and FIG. 4 provided by the embodiments of the present disclosure are merely two listed structures, and there may be avalanche photodiodes in other structures. For example, in the embodiment of the present disclosure, apart from the heavily-doped regions (N+ and P+), a doping concentration of the second type doping region (I) and the first type doping region (P) is determined by device design, such as thicknesses of all layers and types of materials, so as to control a distribution of an internal electric field of a device. The doping concentration is not absolutely at a certain level, but may be set according to actual requirements.

In specific implementation, a film layer where the central electrode is located and a film layer where the annular electrode is located, which are both electrically connected to the avalanche photodiode, are not flat, in order to improve flatness, the above detection substrate provided by the embodiment of the present disclosure, as shown in FIG. 2 and FIG. 4, may further includes: a first planarization layer 5 located on a side of the driving back plate 100 facing the avalanche photodiodes 200, and a second planarization layer 6 located on a side of the avalanche photodiodes 200 facing the driving back plate 100.

As shown in FIG. 2, the first planarization layer 5 is arranged to be flush with the first bonding electrode 31, and the second planarization layer 6 is arranged to be flush with the second bonding electrode 32.

As shown in FIG. 4, the first planarization layer 5 is arranged to be flush with the first bonding electrode (311 and 411), and the second planarization layer 6 is arranged to be flush with the second bonding electrode (312 and 412).

In specific implementation, materials of the first planarization layer 5 and the second planarization layer 6 may be $SiO_2$, and of course may also be other insulating materials.

Certainly, in specific implementation, there may be no first planarization layer 5 or second planarization layer 6 in the above detection substrate.

In specific implementation, the above detection substrate provided by the embodiment of the present disclosure, as shown in FIG. 2, may further include a third planarization layer 7 located between the thin-film transistor 2 and the first bonding electrode 31, the first bonding electrode 31 is electrically connected to the source electrode 23 of the thin-film transistor 2 through a via hole V that penetrates through the third planarization layer 7, and the via hole V is filled with conductive parts.

In specific implementation, the above detection substrate provided by the embodiment of the present disclosure, as shown in FIG. 4, further includes a third planarization layer 7 located between the thin-film transistor 2 and the first bonding electrodes (311 and 411), the first bonding electrodes (311 and 411) are electrically connected to the source electrode 23 of the thin-film transistor 2 through the via hole V that penetrates through the third planarization layer 7, and the via hole V is filled with the conductive parts.

In specific implementation, a material of the third planarization layer 7 is generally resin.

Figure 7:
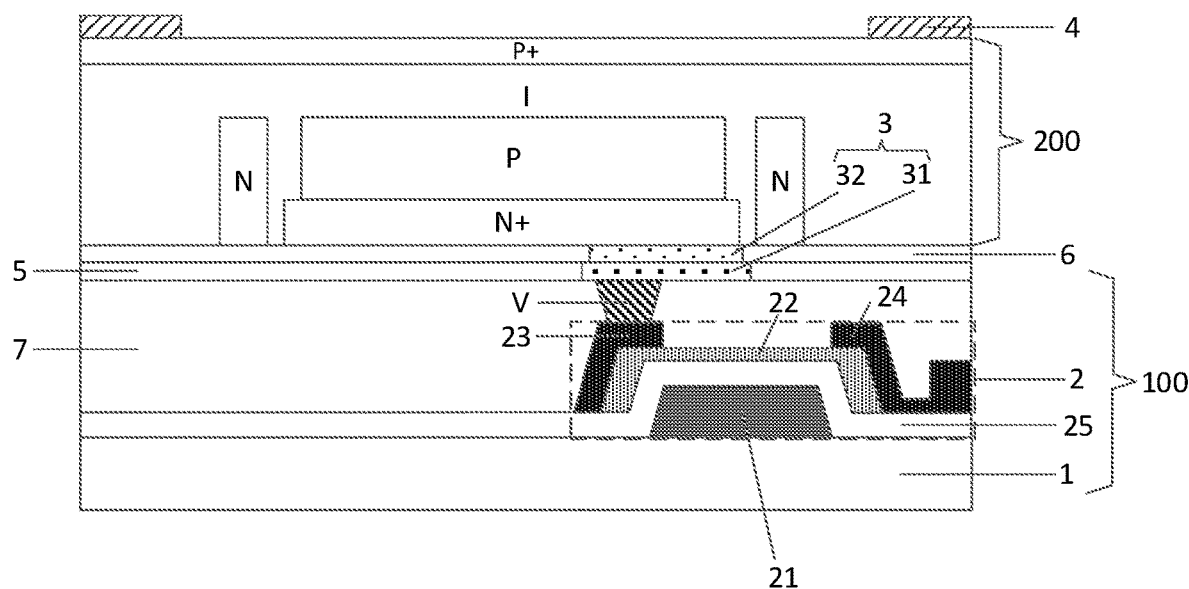
FIG. 7 is another sectional schematic structural diagram of a detection substrate provided by an embodiment of the present disclosure.
Figure 8:
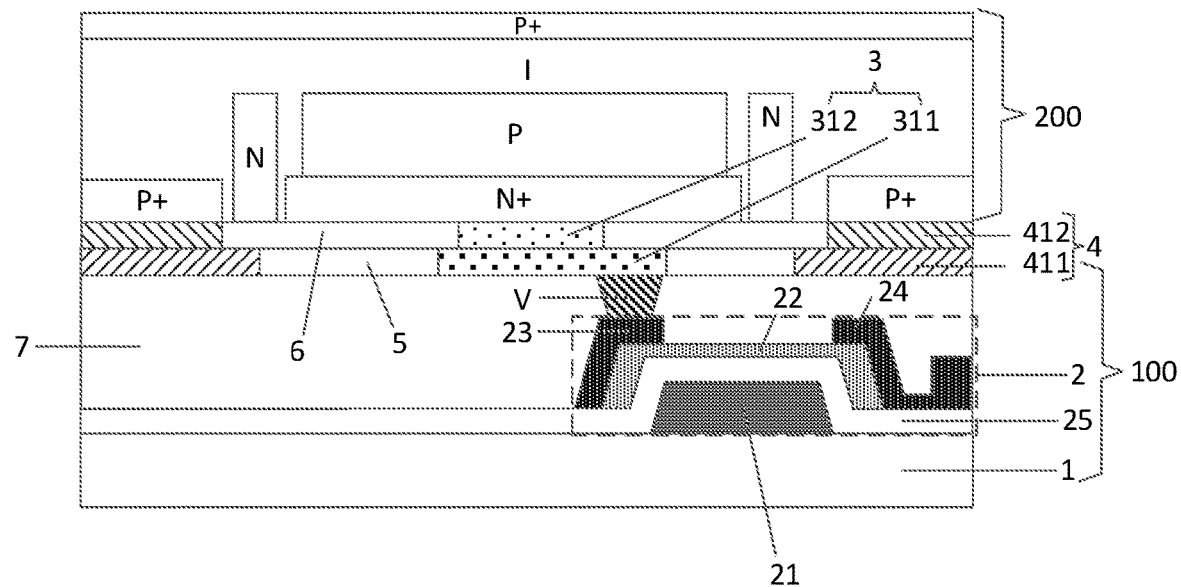
FIG. 8 is another sectional schematic structural diagram of a detection substrate provided by an embodiment of the present disclosure.

In specific implementation, because the electric field in the heavily-doped N-type region of the avalanche photodiode is relatively high, in order to avoid avalanche breakdown at an edge of the P-N junction when the reverse high bias voltage is applied to the avalanche photodiode, the above detection substrate provided by the embodiment of the present disclosure, as shown in FIG. 7 and FIG. 8, may further include a protective ring (N) arranged around the heavily-doped N-type region (N+). Specifically, when the above avalanche photodiode is manufactured, a layer of an annular N-type material is deposited to form the protective ring (N), and avalanche breakdown at the edge of the P-N junction may be avoided when the reverse high bias voltage is applied to the avalanche photodiode.

In specific implementation, in the above detection substrate provided by the embodiment of the present disclosure, as shown in FIG. 7 and FIG. 8, an orthographic projection of the protective ring (N) on the base substrate 1 is located between an orthographic projection of the central electrode 3 on the base substrate 1 and an orthographic projection of the annular electrode 4 on the base substrate 1.

In specific implementation, a height of the annular protective ring may be 1 μm to 5 μm, and a diameter of the annular protective ring may be 10 nm to 500 nm.

In specific implementation, in the above detection substrate provided by the embodiment of the present disclosure, a protective ring (P) may further be added on an inner side of the annular heavily-doped P-type region (P+) in the structure shown in FIG. 8, or a layer of protective ring (P) wrapping the heavily-doped P-type region (P+) is manufactured, so as to further avoid avalanche breakdown at the edge of the P-N junction when the reverse high bias voltage is applied to the avalanche photodiode.

In specific implementation, in the above detection substrate provided by the embodiment of the present disclosure, the first bonding electrode and the second bonding electrode may be formed by depositing a patterned metal using a masking manner or performing an etching process after depositing a metal.

In specific implementation, in the above detection substrate provided by the embodiment of the present disclosure, each avalanche photodiode is formed by a standard micrometer level CMOS process. The avalanche photodiode needs to be stripped off after pasting a Si base CMOS current sheet. It may be stripped off by a laser process. A specific manufacturing process will be introduced in a following manufacturing method.

In specific implementation, in the above detection substrate provided by the embodiment of the present disclosure, a material of the avalanche photodiode may be: formed by doping a Si base material (working in a short wavelength region and widely applied to detecting light below 0.9 um), or formed by doping a Ge or InGaAs-APD base material (working in a long wavelength region and detecting long-wavelength light of over 1 um).

In specific implementation, in the above detection substrate provided by the embodiment of the present disclosure, as shown in FIG. 2, FIG. 4, FIG. 7 and FIG. 8, the thin-film transistor 2 includes a gate electrode 21, a gate insulating layer 25, a source layer 22, a source electrode 23, and a drain electrode 24 which are laminated in sequence on the base substrate 1. The thin-film transistor 2 may be formed by an a-Si, IGZO or LTPS process.

Figure 9:
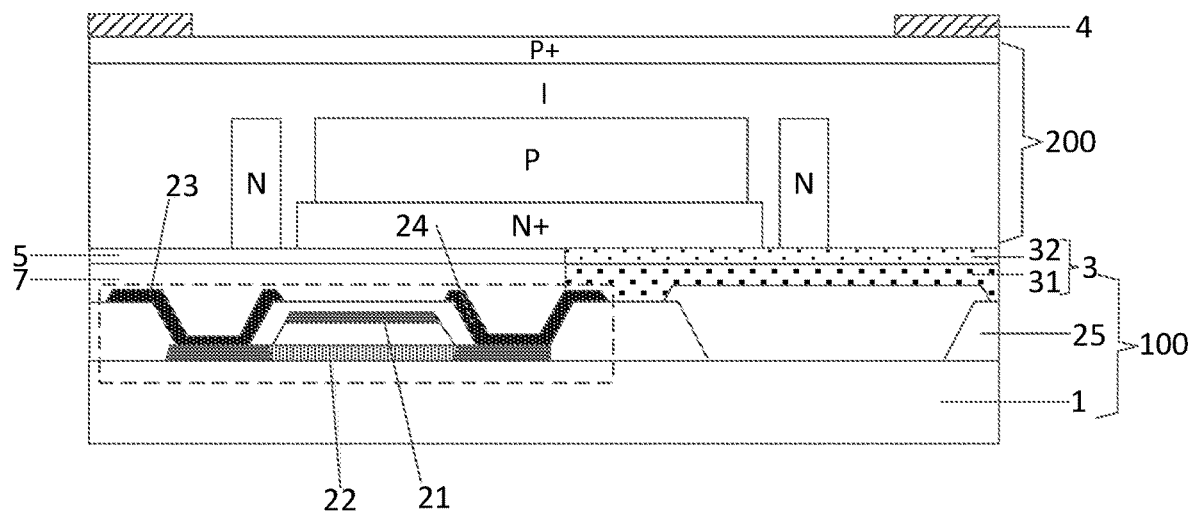
FIG. 9 is another sectional schematic structural diagram of a detection substrate provided by an embodiment of the present disclosure.

In specific implementation, in the above detection substrate provided by the embodiment of the present disclosure, as shown in FIG. 2, FIG. 4, FIG. 7 and FIG. 8, all the thin-film transistors 2 of the driving back plate 100 are a bottom gate type; and the thin-film transistors 2 may also be a top gate type, as shown in FIG. 9.

In specific implementation, the above detection substrate provided by the embodiment of the present disclosure, as shown in FIG. 2, FIG. 4, FIG. 7, FIG. 8 and FIG. 9, may further includes a flickering layer (not shown) located on a side of the avalanche photodiodes 200 facing away from the base substrate 1. Specifically, the flickering layer is configured to convert an irradiation signal into a photosignal. Any suitable flickering materials may be used to manufacture the flickering layer. In some embodiments, a flickering material is a light wavelength converting material converting radiation (for example, an X ray) into visible light. The flickering material may include but is not limited to thallium-activated cesium iodide and sodium-activated cesium iodide. The cesium iodide is a material sensitive to light.

Figure 10:
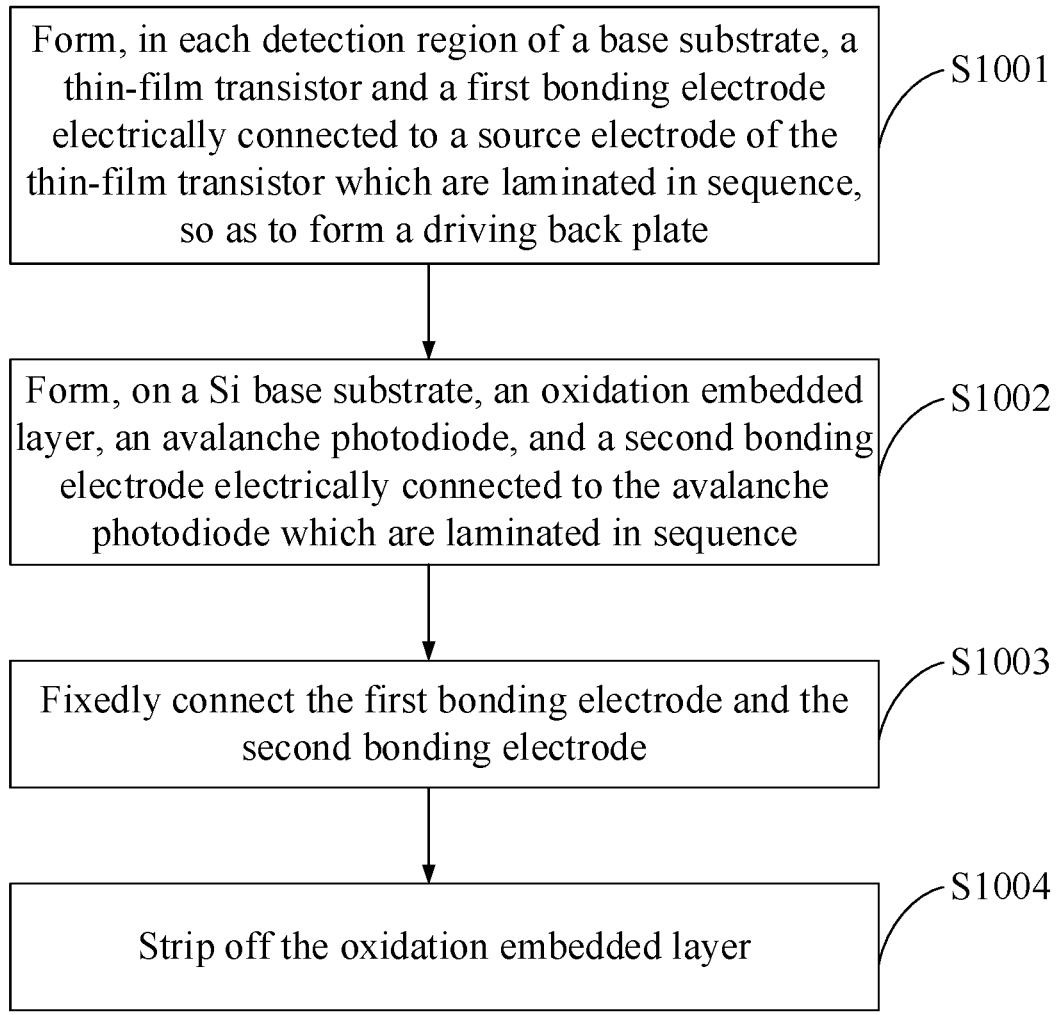
FIG. 10 is a flow chart of a manufacturing method of a detection substrate provided by an embodiment of the present disclosure.

Based on the same inventive concept, an embodiment of the present disclosure further provides a method for manufacturing the above detection substrate, as shown in FIG. 10, including the following operations.

S1001, a thin-film transistor and a first bonding electrode electrically that is connected to a source electrode of the thin-film transistor, which are laminated in sequence are formed in each detection region of a base substrate, so as to form a driving back plate.

S1002, an oxidation embedded layer, an avalanche photodiode, and a second bonding electrode that is electrically connected to the avalanche photodiode, which are laminated in sequence are formed on a Si base substrate.

S1003, the first bonding electrode and the second bonding electrode are fixedly connected.

S1004, the oxidation embedded layer is stripped off.

According to the method for manufacturing the detection substrate provided by the embodiment of the present disclosure, because large-size production may be realized by means of the driving back plate made of the thin-film transistors, and the avalanche photodiodes can realize weak light detection, the detection substrate of the present disclosure that is formed by the driving back plate and the avalanche photodiodes in an electrode binding manner may realize characteristics of a large size and weak light detection at the same time.

The manufacturing method for the detection substrate shown in FIG. 2 and FIG. 4 will be described in detail below.

Embodiment 1: A method for manufacturing a detection substrate shown in FIG. 2 is as follows.

Figure 11A:
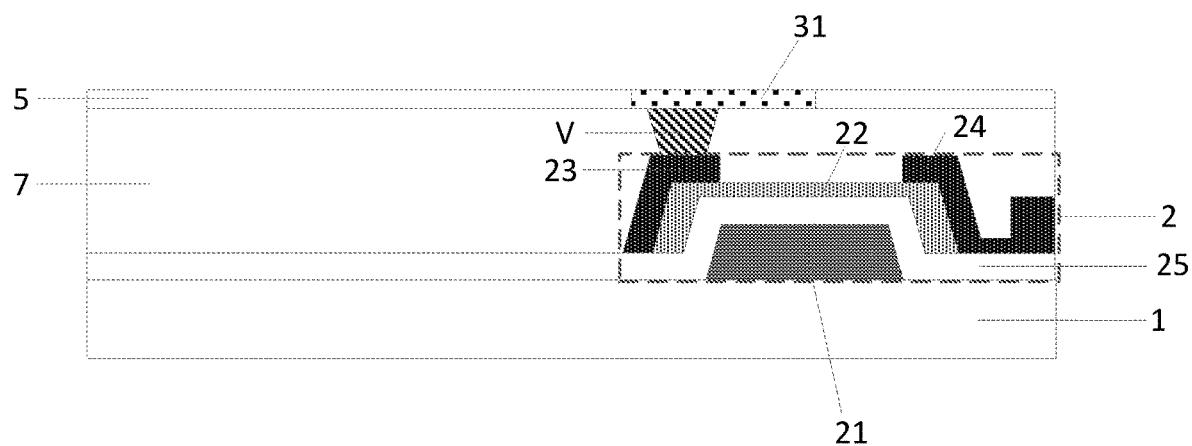
FIG. 11A to FIG. 11F are sectional schematic structural diagrams of the detection substrate shown in FIG. 2 provided by the embodiment of the present disclosure after executing each step respectively.

(1) A thin-film transistor 2, a third planarization layer 7, a first bonding electrode 31 that is electrically connected to a source electrode 23 of the thin-film transistor 2 and a first planarization layer 5 are laminated in sequence on a base substrate 1, and the first bonding electrode 31 is electrically connected to the source electrode 23 through a via hole V that penetrates through the third planarization layer 7, as shown in FIG. 11A. Specifically, a process for manufacturing the thin-film transistor 2 is the same as the related art, which will not be described in detail herein.

Figure 11B:
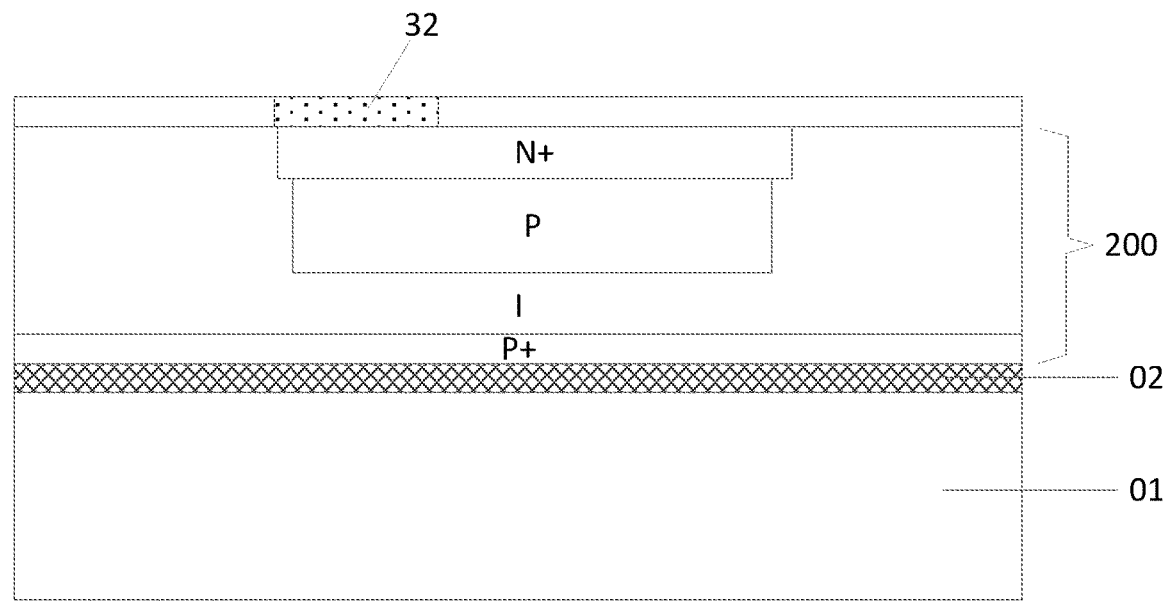

(2) An oxidation embedded layer 02, an avalanche photodiode 200, a second bonding electrode 32 that is electrically connected to a heavily-doped N-type region (N+) of the avalanche photodiode 200 and a second planarization layer 6 are laminated in sequence on a Si base substrate 01, as shown in FIG. 11B. The avalanche photodiode 200 is formed through an existing CMOS process, the three film layers, i.e., the Si base substrate 01, the oxidation embedded layer 02 and the heavily-doped P-type region (P+), constitute an SOI wafer, and other regions of the avalanche photodiode 200 are formed by the CMOS process on the SOI wafer.

Figure 11C:
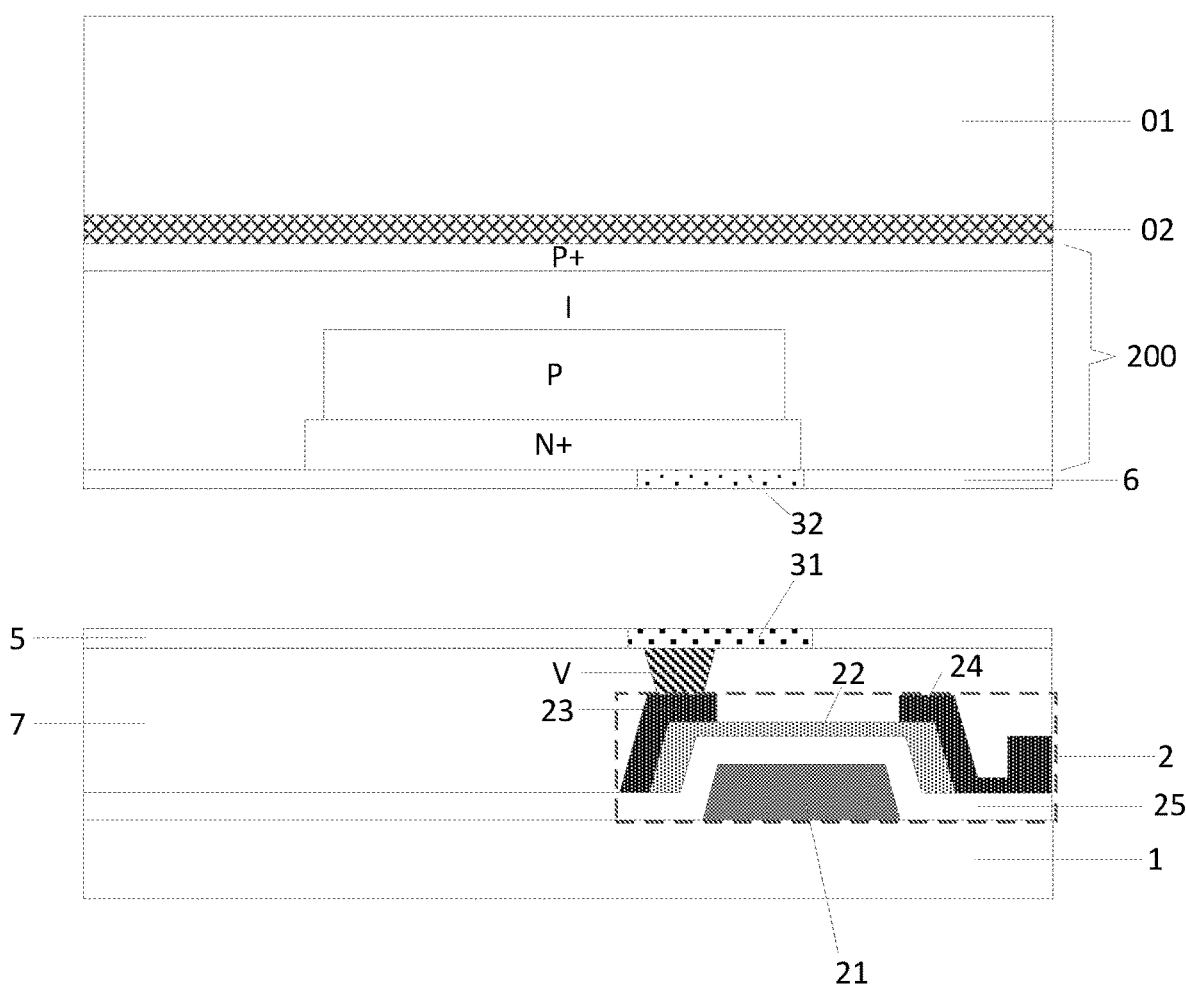

(3) A structure obtained in step (2) shown in FIG. 11B is overturned, then the second bonding electrode 32 and the first bonding electrode 31 in a structure obtained in step (1) shown in FIG. 11A are aligned, as shown in FIG. 11C. Specifically, aligning marks may be arranged on both the base substrate 1 and the Si base substrate 01.

Figure 11D:
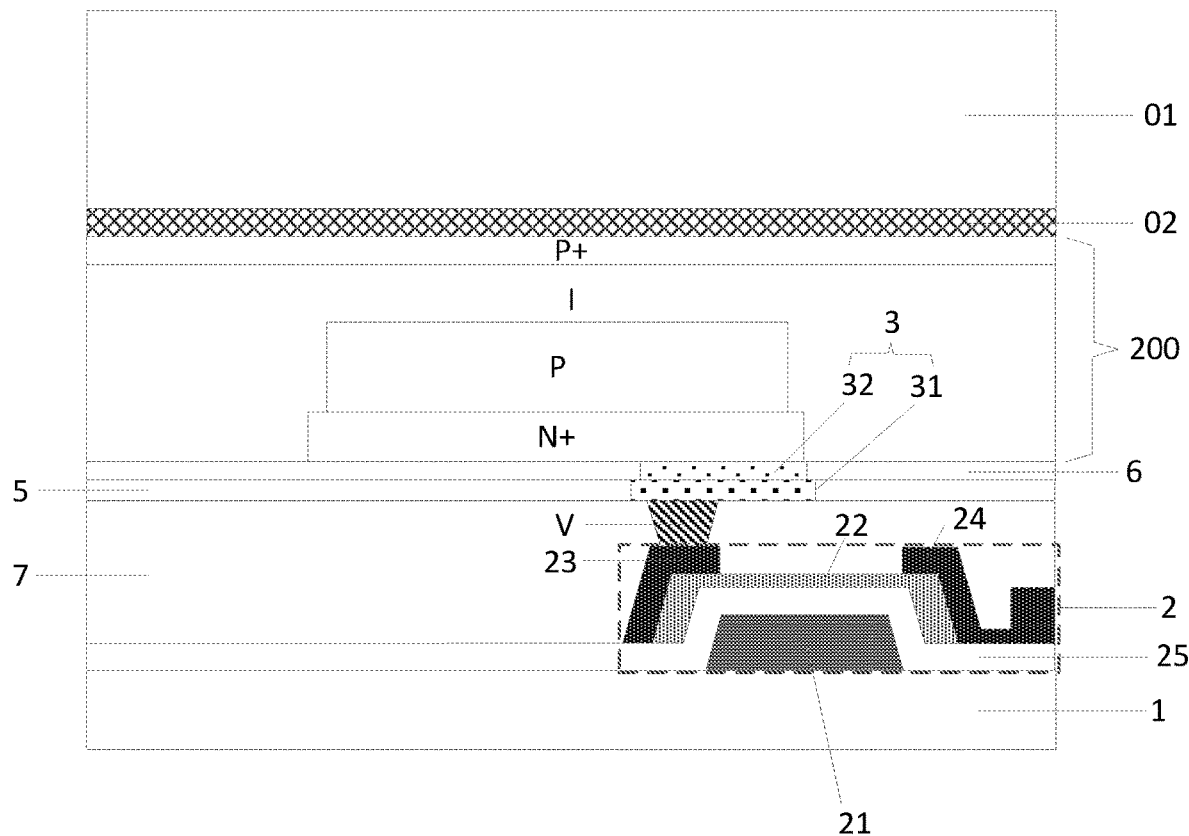

(4) The first bonding electrode 31 and the second bonding electrode 32 in step (3) are electrically connected through conductive adhesive (such as ACF), so as to form a central electrode 3, as shown in FIG. 11D.

Figure 11E:
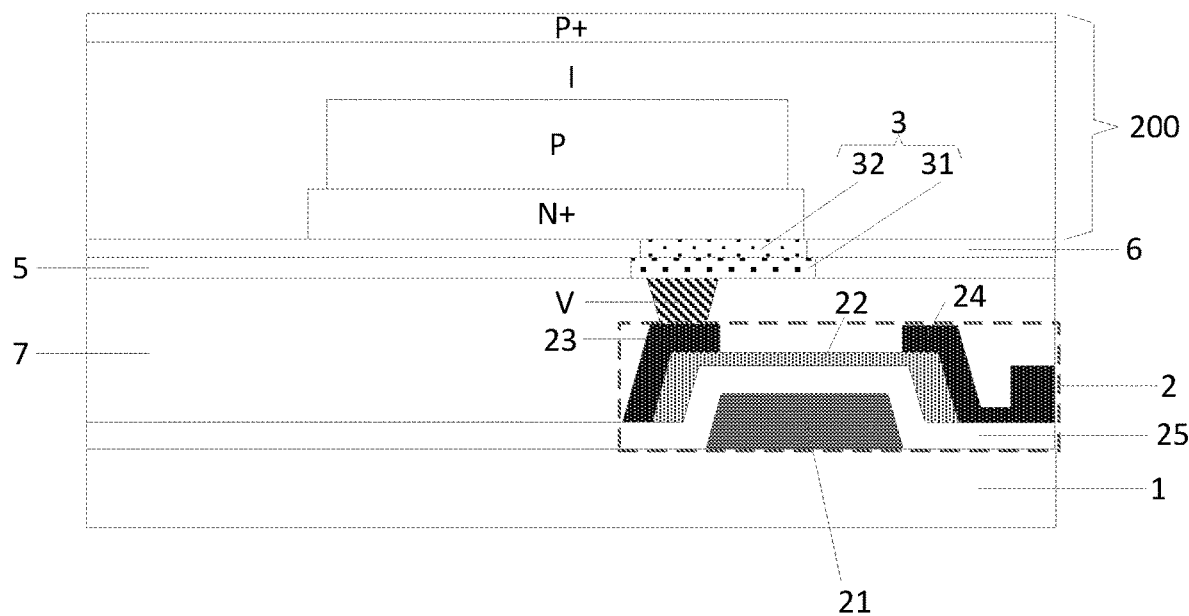

(5) The oxidation embedded layer 02 is stripped off in a laser stripping manner, as shown in FIG. 11E.

Figure 11F:
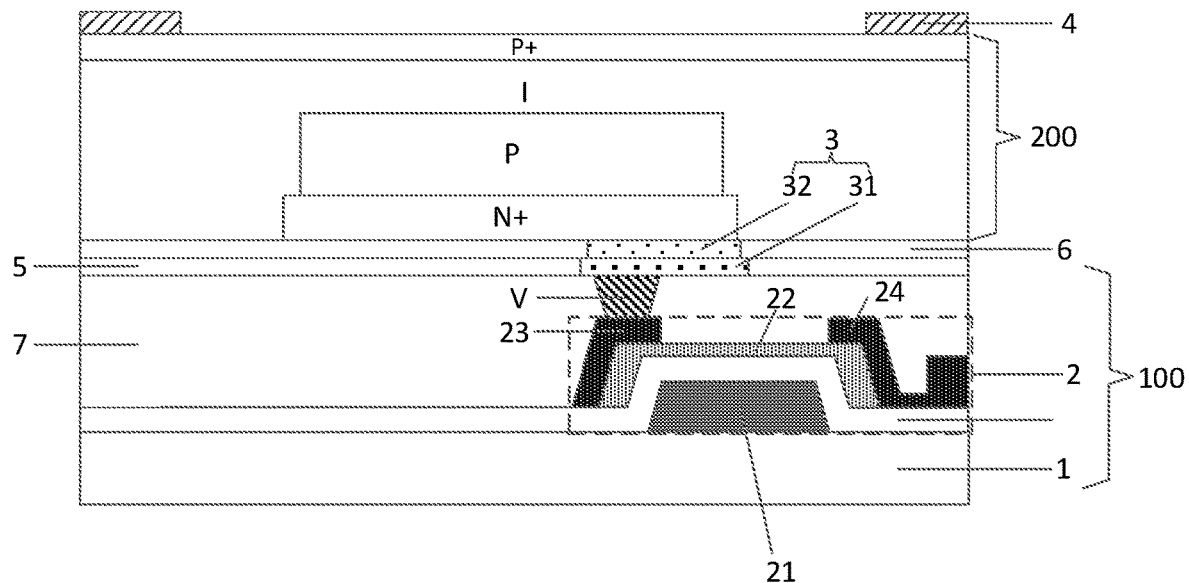

(6) An annular electrode 4 electrically connected to a heavily-doped P-type region of the avalanche photodiode 200 is formed on a side of the avalanche photodiode 200 facing away from the base substrate 1, as shown in FIG. 11F. Specifically, the annular electrode 4 may be formed by depositing a patterned metal in a masking manner or performing an etching process after depositing a metal.

Though steps (1) to (6) in the above embodiment 1, the detection substrate shown in FIG. 2 provided by the embodiment of the present disclosure may be manufactured.

Embodiment 2: A manufacturing method of a detection substrate shown in FIG. 4 is as follows.

Figure 12A:
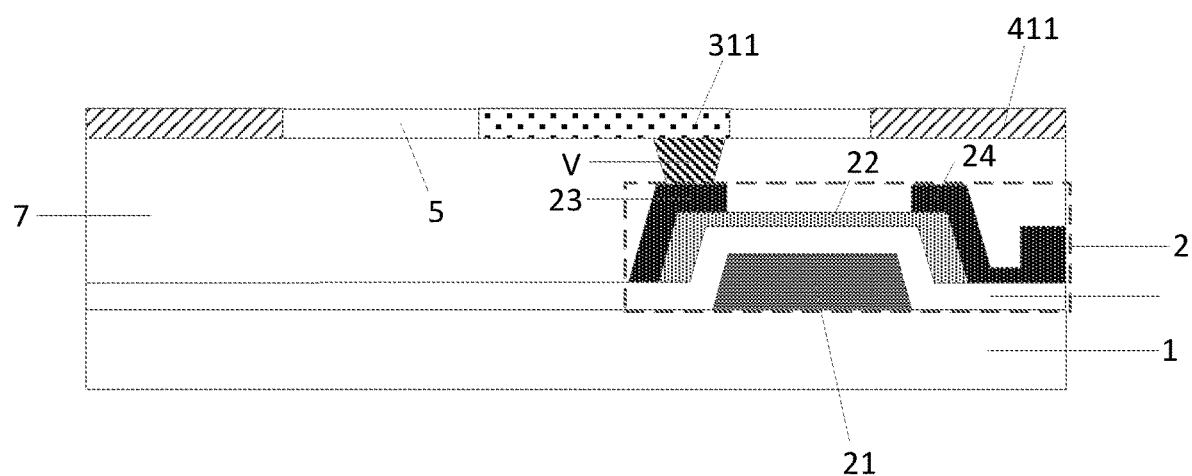
FIG. 12A to FIG. 12D are sectional schematic structural diagrams of the detection substrate shown in FIG. 4 provided by the embodiment of the present disclosure after executing each step respectively.

(1) A thin-film transistor 2, a third planarization layer 7, a first central electrode 311 that is electrically connected to a source electrode 23 of the thin-film transistor 2, a first annular electrode 411 arranged around the first central electrode 311 and a first planarization layer 5 are laminated in sequence on a base substrate 1, and the first central electrode 311 is electrically connected to the source electrode 23 through a via hole V that penetrates through the third planarization layer 7, as shown in FIG. 12A. Specifically, the first central electrode 311 and the first annular electrode 411 are formed by a one-time patterning process. A manufacturing process for the thin-film transistor 2 is the same as the related art, which will not be described in detail herein.

Figure 12B:
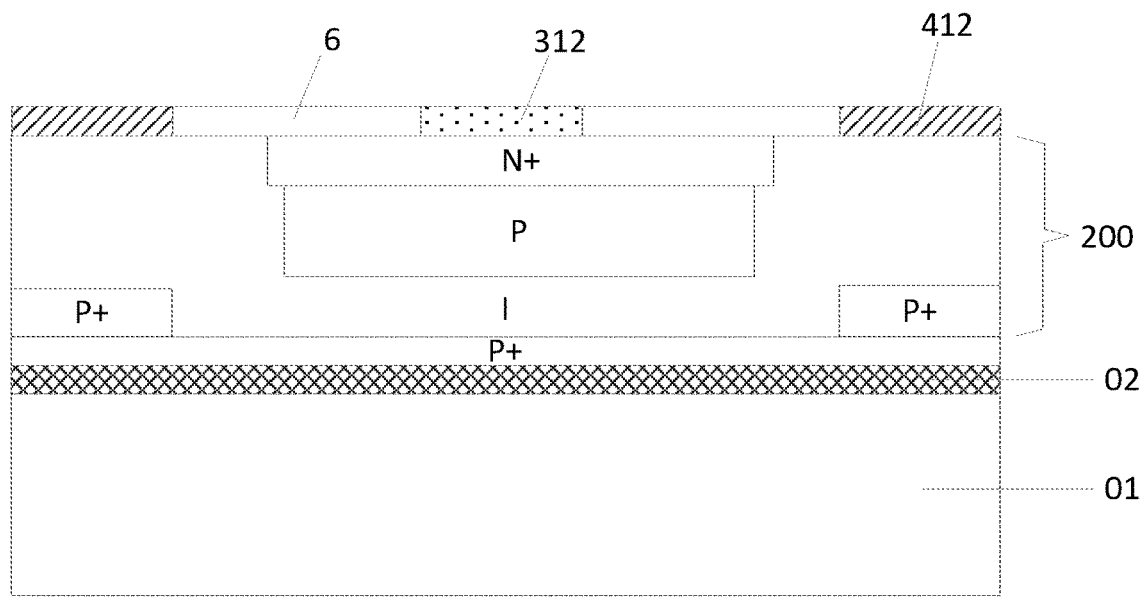

(2) An oxidation embedded layer 02, a heavily-doped P-type region (P+), an avalanche photodiode 200, a second central electrode 312 that is electrically connected to a heavily-doped N-type region (N+) of the avalanche photodiode 200, a second annular electrode 412 arranged around the second central electrode 312 and a second planarization layer 6 are laminated in sequence on a Si base substrate 01, as shown in FIG. 12B. The second central electrode 312 and the second annular electrode 412 are formed by a one-time patterning process. The avalanche photodiode 200 is formed through an existing CMOS process, the heavily-doped P-type region of the avalanche photodiode 200 is arranged around the heavily-doped N-type region, the three film layers, i.e., the Si base substrate 01, the oxidation embedded layer 02, and the heavily-doped P-type region (P+), constitute an SOI wafer, and other regions of the avalanche photodiode 200 are formed by the CMOS process on the SOI wafer.

Figure 12C:
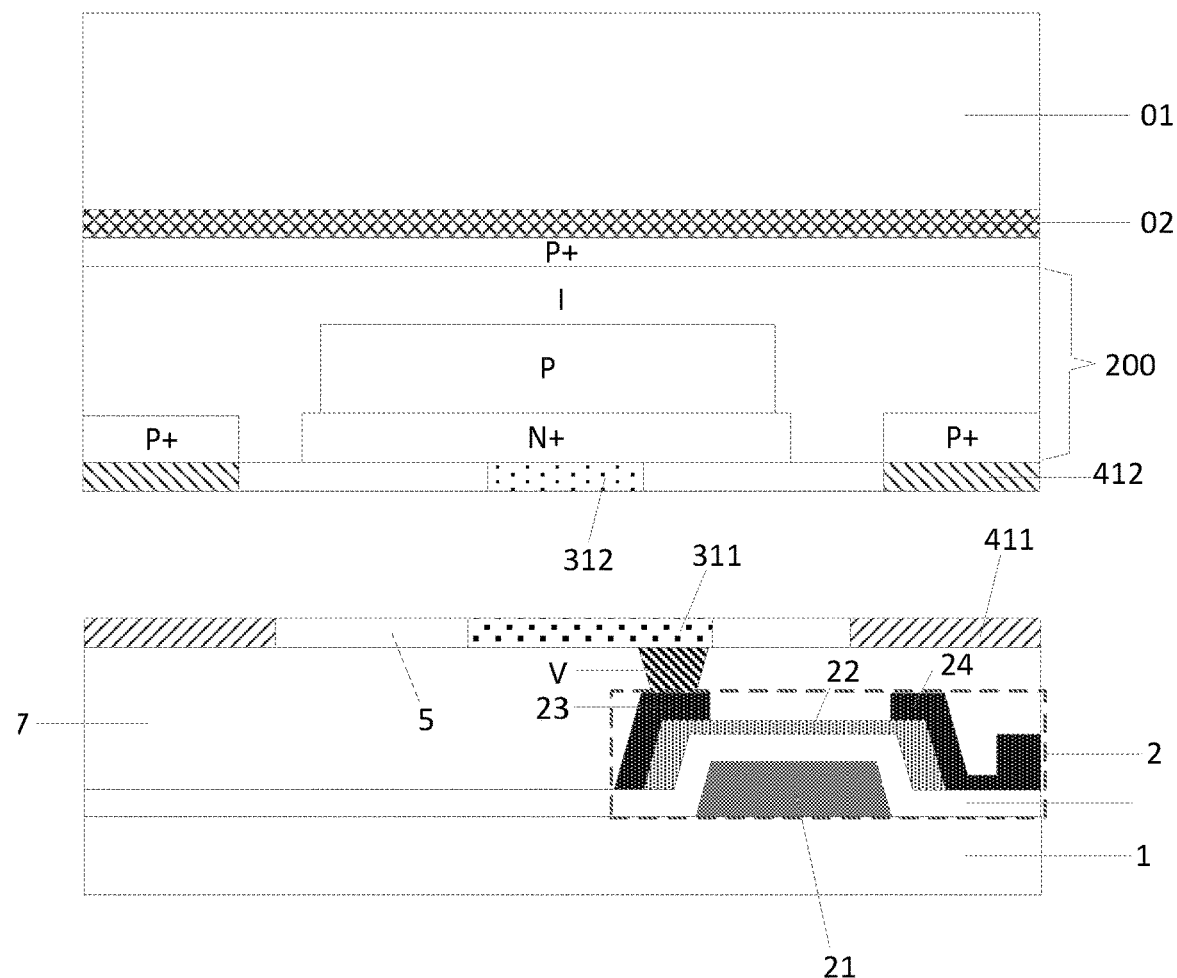

(3) A structure obtained in step (2) shown in FIG. 12B is overturned, then the second central electrode 312 and the first central electrode 311 in a structure obtained in step (1) shown in FIG. 12A are aligned, and the second annular electrode 412 and the first annular electrode 411 in a structure obtained in step (1) shown in FIG. 12A are aligned, as shown in FIG. 12C. Specifically, aligning marks may be arranged on the base substrate 1 and the Si base substrate 01.

Figure 12D:
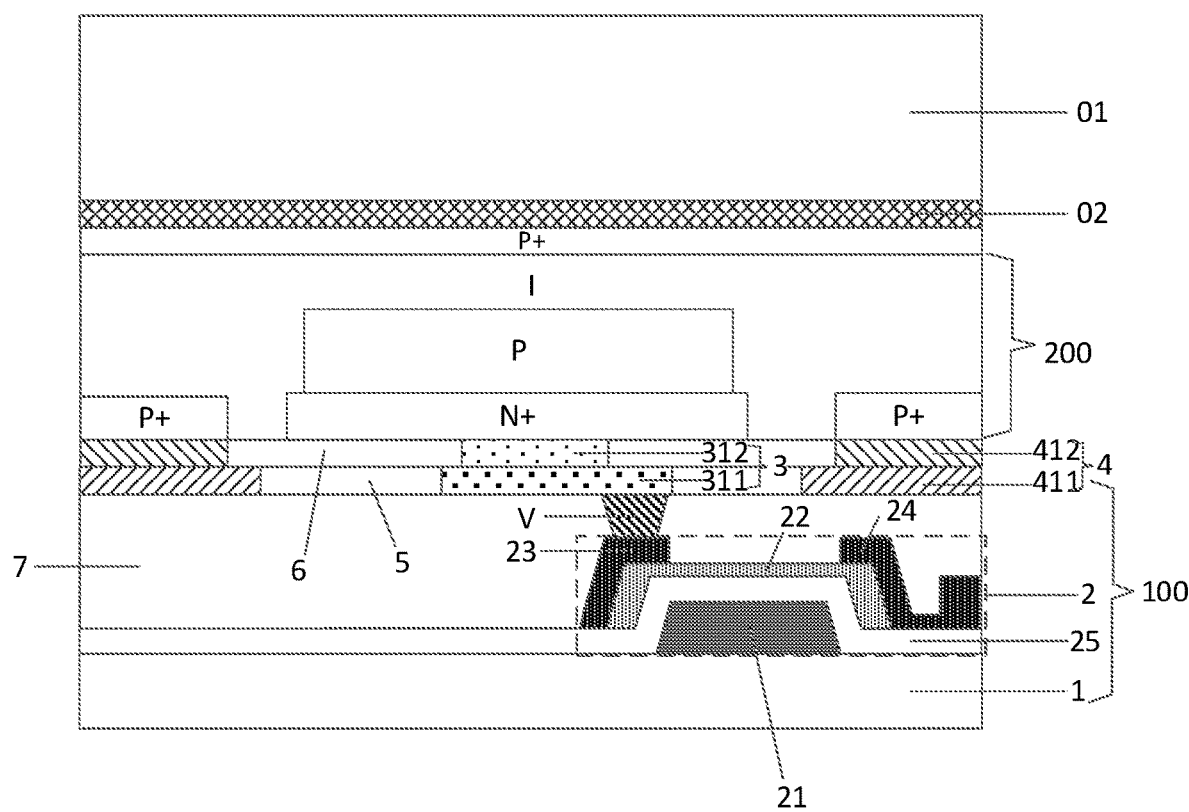

(4) The second central electrode 312 and the first central electrode 311 in step (3) are electrically connected through conductive adhesive (such as ACF), so as to form a central electrode 3; and the second annular electrode 412 and the first annular electrode 411 in step (3) are electrically connected through conductive adhesive (such as ACF), as shown in FIG. 12D.

(5) The oxidation embedded layer 02 is stripped off in a laser stripping manner, as shown in FIG. 4.

Though steps (1) to (5) in the above embodiment 2, the detection substrate shown in FIG. 4 provided by the embodiment of the present disclosure may be manufactured.

Based on the same inventive concept, an embodiment of the present disclosure further provides a ray detection apparatus, including any one of the above detection substrates provided by the embodiment of the present disclosure. A problem solving principle of the ray detection apparatus is the same as the above detection substrate, so for implementation of the ray detection apparatus, reference may be made to implementation of the above detection substrate, which will not be repeated here.

The ray detection apparatus provided by the embodiment of the present disclosure may be applied to a medical X-ray detector, and may also be used for other aspects, space nuclear detection, biological weak light detection, etc. The driving back plate in the above detection substrate may also be flexible so as to be applied to a flexible detector.

According to the detection substrate, the manufacturing method therefor and the ray detection apparatus provided by the embodiment of the present disclosure, the detection substrate includes: a driving back plate, wherein the driving back plate has a plurality of detection regions, and each detection region includes a thin-film transistor located on a base substrate, and a first bonding electrode that is located on the thin-film transistor and is electrically connected to a source electrode of the thin-film transistor; and a plurality of avalanche photodiodes, wherein the plurality of avalanche photodiodes are arranged in the detection regions one by one, and a second bonding electrode that is fixedly connected to the first bonding electrode is arranged on a side of each avalanche photodiode that faces the driving back plate. Since large-size production can be realized by means of the driving back plate made of a thin-film transistor, and avalanche photodiodes can realize weak light detection, the detection substrate of the present disclosure that is formed by the driving back plate and the avalanche photodiodes in an electrode binding manner can realize the characteristics of a large size and weak light detection at the same time.

Obviously, those skilled in the art can make various changes and modifications to the disclosure without departing from the spirit and scope of the disclosure. Thus, if these modifications and variations of the present disclosure fall within the scope of the claims of the present disclosure and their equivalents, the present disclosure is also intended to include these modifications and variations.

What is claimed is:

1. A detection substrate, comprising:
a driving back plate, comprising a plurality of detection regions, and each detection region comprises a thin-film transistor located on a base substrate, and a first bonding electrode located on the thin-film transistor and is electrically connected to a source electrode of the thin-film transistor; and
a plurality of avalanche photodiodes, wherein the plurality of avalanche photodiodes are arranged in the plurality of detection regions one by one, and a second bonding electrode fixedly connected to the first bonding electrode is arranged on a side of each avalanche photodiode facing the driving back plate;
wherein the first bonding electrode and the second bonding electrode constitute a central electrode, and an annular electrode is arranged on a side of each avalanche photodiode facing away from the driving back plate.

2. The detection substrate according to claim 1, wherein the first bonding electrode is fixedly connected to the second bonding electrode through conductive adhesive.

3. The detection substrate according to claim 1, wherein the first bonding electrode is the same as the second bonding electrode in shape, and an orthographic projection of the second bonding electrode on the base substrate is located within a scope of an orthographic projection of the first bonding electrode on the base substrate.

4. The detection substrate according to claim 1, wherein the each avalanche photodiode comprises a heavily-doped N-type region, a first type doping region, a second type doping region and a heavily-doped P-type region which are laminated in sequence between a film layer where the second bonding electrode is located and a film layer where the annular electrode is located; and
the heavily-doped P-type region is electrically connected to the annular electrode, and the heavily-doped N-type region is electrically connected to the second bonding electrode.

5. The detection substrate according to claim 1, wherein the each avalanche photodiode further comprises a reference voltage wire electrically connected to the annular electrode, the reference voltage wire is arranged on a same layer as the annular electrode, and the reference voltage wire is located between two adjacent rows of the detection regions.

6. The detection substrate according to claim 1, wherein the first bonding electrode comprises a first central electrode and a first annular electrode arranged around the first central electrode arranged on the same layer, and the second bonding electrode comprises a second central electrode and a second annular electrode arranged around the second central electrode arranged on the same layer; and
the first central electrode and the second central electrode are electrically connected to constitute a central electrode, and the first annular electrode and the second annular electrode are electrically connected to constitute an annular electrode.

7. The detection substrate according to claim 6, wherein the each avalanche photodiode comprises: a heavily-doped N-type region, a heavily-doped P-type region arranged around the heavily-doped N-type region, a first type doping region located on a side of the heavily-doped N-type region facing away from a corresponding thin-film transistor, and a second type doping region located on the first type doping region and covering a corresponding detection region; wherein
the heavily-doped N-type region is electrically connected to a corresponding central electrode, and the heavily-doped P-type region is electrically connected to a corresponding annular electrode.

8. The detection substrate according to claim 6, further comprising a reference voltage wire electrically connected to the annular electrode, wherein the reference voltage wire is arranged on a same layer as the first annular electrode, and the reference voltage wire is located between two adjacent rows of the detection regions.

9. The detection substrate according to claim 1, further comprising: a first planarization layer located on a side of the driving back plate facing the avalanche photodiodes, and a second planarization layer located on a side of the avalanche photodiodes facing the driving back plate; wherein
the first planarization layer is arranged to be flush with the first bonding electrode, and the second planarization layer is arranged to be flush with the second bonding electrode.

10. The detection substrate according to claim 4, further comprising a protective ring arranged around the heavily-doped N-type region.

11. A ray detection apparatus, comprising a detection substrate, wherein the detection substrate comprises:
a driving back plate, comprising a plurality of detection regions, and each detection region comprises a thin-film transistor located on a base substrate, and a first bonding electrode located on the thin-film transistor and is electrically connected to a source electrode of the thin-film transistor; and
a plurality of avalanche photodiodes, wherein the plurality of avalanche photodiodes are arranged in the plurality of detection regions one by one, and a second bonding electrode fixedly connected to the first bonding electrode is arranged on a side of each avalanche photodiode facing the driving back plate;
wherein the first bonding electrode and the second bonding electrode constitute a central electrode, and an annular electrode is arranged on a side of each avalanche photodiode facing away from the driving back plate.

12. A method for manufacturing the detection substrate according to claim 1, comprising:
forming, in the each detection region of the base substrate, the thin-film transistor and the first bonding electrode electrically connected to the source electrode of the thin-film transistor laminated in sequence, so as to form the driving back plate;
forming, on a Si base substrate, an oxidation embedded layer, an avalanche photodiode, and the second bonding electrode electrically connected to the avalanche photodiode laminated in sequence;
fixedly connecting the first bonding electrode and the second bonding electrode; and
stripping off the oxidation embedded layer.

13. The ray detection apparatus according to claim 11, wherein the first bonding electrode is fixedly connected to the second bonding electrode through conductive adhesive.

14. The ray detection apparatus according to claim 11, wherein the first bonding electrode is the same as the second bonding electrode in shape, and an orthographic projection of the second bonding electrode on the base substrate is located within a scope of an orthographic projection of the first bonding electrode on the base substrate.

15. The ray detection apparatus according to claim 11, wherein the each avalanche photodiode comprises a heavily-doped N-type region, a first type doping region, a second type doping region and a heavily-doped P-type region which are laminated in sequence between a film layer where the second bonding electrode is located and a film layer where the annular electrode is located; and the heavily-doped P-type region is electrically connected to the annular electrode, and the heavily-doped N-type region is electrically connected to the second bonding electrode.

16. The ray detection apparatus according to claim 11, wherein the each avalanche photodiode further comprises a reference voltage wire electrically connected to the annular electrode, the reference voltage wire is arranged on a same layer as the annular electrode, and the reference voltage wire is located between two adjacent rows of the detection regions.

17. The ray detection apparatus according to claim 11, wherein the first bonding electrode comprises a first central electrode and a first annular electrode arranged around the first central electrode arranged on the same layer, and the second bonding electrode comprises a second central electrode and a second annular electrode arranged around the second central electrode arranged on the same layer; and the first central electrode and the second central electrode are electrically connected to constitute a central electrode, and the first annular electrode and the second annular electrode are electrically connected to constitute an annular electrode.

18. The ray detection apparatus according to claim 17, wherein the each avalanche photodiode comprises: a heavily-doped N-type region, a heavily-doped P-type region arranged around the heavily-doped N-type region, a first type doping region located on a side of the heavily-doped N-type region facing away from a corresponding thin-film transistor, and a second type doping region located on the first type doping region and covering a corresponding detection region; wherein the heavily-doped N-type region is electrically connected to a corresponding central electrode, and the heavily-doped P-type region is electrically connected to a corresponding annular electrode.

\* \* \* \* \*